(12) United States Patent
Li et al.

(10) Patent No.: US 9,214,642 B2
(45) Date of Patent: Dec. 15, 2015

(54) OLED DEVICE AND MANUFACTURING METHOD THEREOF, DISPLAY APPARATUS

(71) Applicant: BOE TECHNOLOGY GROUP CO., LTD., Beijing (CN)

(72) Inventors: Na Li, Beijing (CN); Joo Hyeon Lee, Beijing (CN); Lujiang Huangfu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/366,838

(22) PCT Filed: Oct. 25, 2013

(86) PCT No.: PCT/CN2013/085996
§ 371 (c)(1),
(2) Date: Jun. 19, 2014

(87) PCT Pub. No.: WO2015/000242
PCT Pub. Date: Jan. 8, 2015

(65) Prior Publication Data
US 2015/0014667 A1    Jan. 15, 2015

(30) Foreign Application Priority Data
Jul. 4, 2013  (CN) .......................... 2013 1 0278282

(51) Int. Cl.
*H01L 27/32*    (2006.01)
*H01L 51/50*    (2006.01)
(Continued)

(52) U.S. Cl.
CPC ........ *H01L 51/5036* (2013.01); *H01L 51/0097* (2013.01); *H01L 51/5096* (2013.01);
(Continued)

(58) Field of Classification Search
CPC .................. H01L 27/3211–27/218; H01L 27/3241–27/3297; H01L 51/5036; H01L 51/56
USPC ............................... 257/40; 438/99
See application file for complete search history.

(56) References Cited

U.S. PATENT DOCUMENTS 5,981,092 A  *  11/1999  Arai et al. .......... 428/690
6,515,314 B1   2/2003  Duggal et al.
(Continued)

FOREIGN PATENT DOCUMENTS

CN  1751400 A  3/2006
CN  102643296 A  8/2012
(Continued)

OTHER PUBLICATIONS

International Search Report, International Preliminary Report on Patentability and Written Opinion of the International Searching Authority of PCT/ON2013/085996 in Chinese, mailed Jan. 30, 2014.
(Continued)

*Primary Examiner* — Daniel Shook
(74) *Attorney, Agent, or Firm* — Collard & Roe, P.C.

(57) ABSTRACT

An OLED device, comprising: a first electrode (10), a second electrode (11) and an organic thin film layer (13); the organic thin film layer comprises a hole layer (103), an electron layer (104) and an organic light emitting layer (105) located between the hole layer (103) and the electron layer (104); and the organic thin film layer (13) further comprises a hole blocking layer (12). The organic light emitting layer (105) comprises a first light emitting unit (1051), a second light emitting unit (1052) and a third light emitting unit (1053). A manufacturing method of an OLED device and a display apparatus comprising an OLED device are provided.

21 Claims, 3 Drawing Sheets

(51) Int. Cl.
    *H01L 51/56* (2006.01)
    *H01L 51/00* (2006.01)

(52) U.S. Cl.
    CPC ......... *H01L27/3211* (2013.01); *H01L 51/0052* (2013.01); *H01L 51/0054* (2013.01); *H01L 51/0055* (2013.01); *H01L 51/0058* (2013.01); *H01L 51/0081* (2013.01); *H01L 51/0082* (2013.01); *H01L 51/0085* (2013.01)

(56) References Cited

U.S. PATENT DOCUMENTS

| | | | |
|---|---|---|---|
| 8,580,403 B2 | 11/2013 | Mizuno et al. | |
| 2004/0161632 A1* | 8/2004 | Seo et al. | 428/690 |
| 2012/0309255 A1 | 12/2012 | Goda | |

FOREIGN PATENT DOCUMENTS

| | | |
|---|---|---|
| CN | 102683614 A | 9/2012 |
| CN | 102754529 A | 10/2012 |
| CN | 103325952 A | 9/2013 |
| CN | 203325976 U | 12/2013 |
| JP | 2002-260858 A | 9/2002 |

OTHER PUBLICATIONS

Chinese Office Action of Chinese Application No. 201310278282.7, mailed Apr. 21, 2015 with English translation.
Second Chinese Office Action of Chinese Application No. 201310278282.7, mailed Jul. 17, 2015 with English translation.
Third Chinese Office Action of Chinese Application No. 201310278282.7, mailed Sep. 11, 2015 with English translation.

* cited by examiner

US 9,214,642 B2

OLED DEVICE AND MANUFACTURING METHOD THEREOF, DISPLAY APPARATUS

CROSS REFERENCE TO RELATED APPLICATIONS

This application is the National Stage of PCT/CN2013/085996 filed on Oct. 25, 2013, which claims priority under 35 U.S.C. §119 of Chinese Application No. 201310278282.7 filed on Jul. 4, 2013, the disclosure of which is incorporated by reference.

TECHNICAL FIELD

Embodiments of the present invention relate to an OLED device and manufacturing method thereof and a display apparatus.

BACKGROUND

An OLED (organic light emitting diode) display is a self-luminous display. As compared to a LCD (liquid crystal display), the OLED display is lighter and thinner because the OLED display does not need a backlight source. Furthermore, the OLED display also has merits of high brightness, low power consumption, wide viewing angle, high response speed, wide operating temperature range, and so on, and thus it is more and more applied to various high-performance display fields.

The light-emitting mechanism of the OLED is that, under the action of an externally-applied electric field, electrons and holes are injected into an organic luminous material from positive and negative electrodes, respectively, and thus they migrate, recombine and decay in the organic luminous material to give off light.

For the OLED device, a relatively large number of holes will gather at a side of the organic luminous material close to an electron transportation layer in the course of light emission because mobility of a hole transportation material is far greater than mobility of an electron transportation material. Thus, this leads to imbalance of transportation between holes and electrons and other carriers, and luminance is greatly reduced.

A typical structure of a conventional OLED device may be that illustrated in FIG. 1, which comprises an anode layer 102', a cathode layer 112' and an organic thin film layer 13' located between these two layers, and furthermore, diverse functional layers including an electron injection layer 1041', an electron transportation layer 1042', a hole injection layer 1031', a hole transportation layer 1032' and an organic light emitting layer 105' may be comprised in the organic thin film layer 13'. The organic light emitting layer 105' usually comprises organic luminous materials for three colors of red, green and blue. To keep holes, electrons and other carriers in balance during the transportation, a hole blocking layer 12' will usually be formed between the organic light emitting layer 105' formed of the organic luminous materials for three colors of red, green and blue and the electron transportation layer 1042'. However, the shortcoming of this structure lies in that, an OLED device with this structure needs to experience multiple patterning processes, so as to form the organic light emitting layer 105' possessing three colors of red, green and blue and the hole blocking layer 12', respectively. In this way, not only the fabrication process is relatively cockamamie and complex, but also requirements on accuracy of workmanship are also relatively high. Thus, yield of products is seriously restraint, and the production cost of products is raised.

SUMMARY

According to embodiments of the present invention, there are provided an OLED device and manufacturing method thereof and a display apparatus, capable of simplifying the production flow of the OLED device, reducing the production cost and improving the product quality.

In one aspect of embodiments of the invention, there is provided an OLED device, comprising: a first electrode, a second electrode and an organic thin film layer located between the first electrode and the second electrode. The organic thin film layer comprises a hole layer, an electron layer and an organic light emitting layer located between the hole layer and the electron layer; the organic thin film layer further comprises a hole blocking layer that is located between the organic light emitting layer and the electron layer; the organic light emitting layer comprises a first light emitting unit, a second light emitting unit and a third light emitting unit; the hole blocking layer and the third light emitting unit have the same material, and they are integrally formed.

In another aspect of embodiments of the invention, there is provided a display apparatus, comprising the OLED device as stated above.

In still another aspect of embodiments of the invention, there is provided a manufacturing method of an OLED device, which comprises a first electrode, a second electrode and an organic thin film layer located between the first electrode and the second electrode, the method including fabrication of the organic thin film layer, which comprises fabrication of a hole layer, fabrication of an organic light emitting layer and fabrication of an electron layer. Further, fabrication of the organic light emitting layer comprises: forming pattern of the first light emitting unit on a surface of the hole layer through one patterning process; forming pattern of the second light emitting unit on a surface of the hole layer through one patterning process; forming a hole blocking layer and the third light emitting unit that have the same producing material above the hole layer with the above structures formed through one patterning process.

BRIEF DESCRIPTION OF THE DRAWINGS

In order to illustrate the technical solution of the embodiments of the disclosure more clearly, the drawings of the embodiments will be briefly described below; it is obvious that the drawings as described below are only related to some embodiments of the disclosure, but not limitative of the disclosure.

DETAILED DESCRIPTION

Hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the embodiments in the invention, those ordinarily skilled in the art can obtain other embodiment(s), without any inventive work, which come(s) within the scope sought for protection by the invention.

Figure 1:
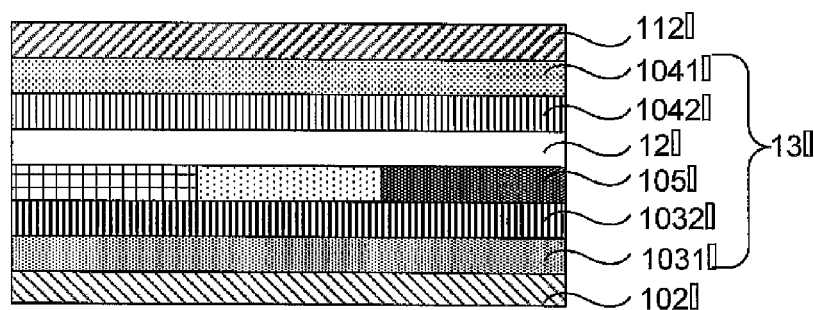
FIG. 1 is a structurally schematic view illustrating a conventional OLED device.
Figure 2:
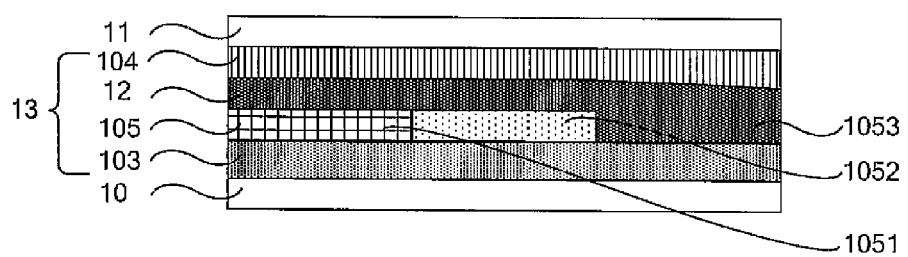
FIG. 2 is a structurally schematic view illustrating an OLED device provided by an embodiment of the invention.

According to an embodiment of the invention, there is provided an OLED device. As illustrated in FIG. 2, it comprises a first electrode 10, a second electrode 11 and an organic thin film layer 13 located between the first electrode 10 and the second electrode 11. Furthermore, the organic thin film layer 13 comprises a hole layer 103, an electron layer 104 and an organic light emitting layer 105 located between the hole layer 103 and the electron layer 104; additionally, the organic thin film layer 13 further comprises a hole blocking layer 12 that is located between the organic light emitting layer 105 and the electron layer 104.

The organic light emitting layer 105 comprises a first light emitting unit 1051, a second light emitting unit 1052 and a third light emitting unit 1053.

The hole blocking layer 12 and the third light emitting unit 1053 have the same material (are formed by the same material), and they are formed through one patterning process.

With respect to the OLED device provided by embodiments of the invention, by means of producing the hole blocking layer and the third light emitting unit with the same material and with the use of one patterning process so that the hole blocking layer and the third light emitting unit are integrally formed, use of one mask can be out down in the manufacturing process of the OLED device. This avoids a system error that occurs when the mask is aligned with the substrate position during its use. Thus, the production flow of the OLED device is effectively simplified, the accuracy of process is enhanced, the quality of products is significantly improved, and the production cost is reduced.

In embodiments of the invention, any existing process of substrate production which can realize patterning can be used as the patterning process. For example, a evaporation process or exposure process using mask may used as the patterning process. For example, as illustrated in FIG. 2, in an example that the hole blocking layer 12 and the third light emitting unit 1053 are formed through one patterning process, patterns of the hole blocking layer 12 and the third light emitting unit 1053 are formed with the same mask by evaporation process.

It is to be noted that, the first electrode 10 and the second electrode 11 may be an anode or a cathode. Hereafter, descriptions will be given to an example in which the first electrode 10 is an anode and the second electrode 11 is a cathode.

Figure 3:
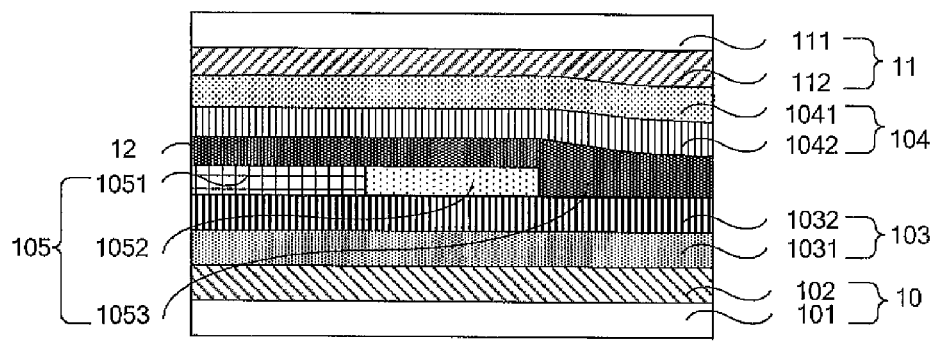
FIG. 3 is a structurally schematic view illustrating an OLED device provided by an embodiment of the invention.

As illustrated in FIG. 3, the first electrode 10 may comprise a first substrate 101 and an anode layer 102 located between the first substrate 101 and a hole layer 103; the second electrode 11 may comprise a second substrate 111 and a cathode layer 112 located between the second substrate 111 and an electron layer 104. The anode layer 102 of the first electrode 10 contacts with the hole layer 103, and the cathode layer 112 of the second electrode 11 contacts with the electron layer 104.

Further, material for producing the first substrate 101 and the second substrate 111 may comprise glass or a flexible material. The flexible material may comprise at least one of polyesters or polyimides. For example, in an embodiment of the invention, material for the first substrate 101 and the second substrate 111 may be glass. With such a transparent material, luminous efficiency of an OLED display device is guaranteed, and meanwhile, sturdiness of the OLED device is further heightened.

Further, material for producing the anode layer 102 may comprise an inorganic material or an organic conductive polymer. The inorganic material may comprise at least one material selected from the group consisting of zinc oxide, zinc tin oxide, indium tin oxide and a metal having a higher work function, such as gold, copper, silver and other metallic material; and the organic conductive polymer may comprise at least one material selected from the group consisting of polythiophene, poly(sodium vinyl benzenesulfonate) and polyaniline. In an embodiment of the invention, material for the anode layer may be, such as indium tin oxide, tin zinc oxide or other transparent conductive material. With such a kind of metal oxide materials, it is possible that luminous efficiency of the OLED device is further enhanced on the basis of guaranteeing strong conductivity of the anode layer. For example, thickness of the anode layer may be in the range of 50 to 200 nm.

Material for producing the cathode layer 112 may comprise a metallic material with a lower work function such as lithium, magnesium, calcium, strontium, aluminum, indium or the like, or an alloy of at least one of the above metallic materials and a metallic material such as copper, gold or silver. For example, thickness of the cathode layer 112 may be in the range of 80 to 120 nm. In an embodiment of the invention, material for the cathode layer 112 may be such as an alloy of magnesium and silver.

The work function of a metal refers to the least energy necessary for an electron, an initial energy of which is equal to the Fermi level, to escape to vacuum from the inside of the metal. Size of the work function symbolizes the degree to which an electron is bound in the metal, and the higher the work function is, the less easily does an electron leave the metal.

As illustrated in FIG. 3, the hole layer 103 may comprise a hole injection layer 1031 and a hole transportation layer 1032 that may be located on a side close to an organic light emitting layer 105.

The electron layer 104 may comprise an electron injection layer 1041 and an electron transportation layer 1042, wherein the electron transportation layer 1042 may be located on a side close to the organic light emitting layer 105.

Further, material for producing the hole injection layer 1031 may comprise at least one material of titanium bronze or star polyamine. For example, thickness of the hole injection layer 1031 may be in the range of 12 to 18 nm. In an embodiment of the invention, a base material for the hole injection layer is such as 4,4',4"-tris[2-naphthyl(phenyl)amino]triphenylamine.

Material for producing the hole transportation layer 1032 may comprise triarylamine materials, and for example, thickness of the hole transportation layer 1032 may be in the range of 50 to 70 nm. In an embodiment of the invention, material for the hole transportation layer 1032 is such as N,N'-bi-(1-naphthyl)-N,N'diphenyl-1,1-xenyl-4,4-diamine.

Material for producing the electron injection layer 1041 may comprise at least one material of lithium fluoride or 8-hydroxyquinolinolato-lithiumlithium, and for example, thickness of the electron injection layer 1041 may be in the range of 1 to 3 nm.

Material for producing the electron transportation layer 1042 may comprise at least one material of a metal organic complex or an ortho-phenanthroline material, and for example, thickness of the electron transportation layer 1042 may be in the range of 20 to 40 nm.

It is to be noted that, the organic light emitting layer 105 comprises a first light emitting unit 1051, a second light emitting unit 1052 and a third light emitting unit 1053, and these three light emitting units in a single color correspond to three primary colors of red, green and blue, respectively, so as to achieve color display of the OLED device. Organic luminous materials for three colors of red, green and blue can be used to fabricate the first light emitting unit 1051, a second light emitting unit 1052 and a third light emitting unit 1053, respectively. For example, the first light emitting unit 1051 is made of any one of the organic luminous materials for three colors of red, green and blue, then the second light emitting unit 1052 and the third light emitting unit 1053 may be made of the organic luminous materials for the other two colors, respectively, and the invention will not set a limit to this.

For example, in the organic light emitting layer 105, the first light emitting unit 1051 provided by embodiments of the invention may be formed of a red emitting material, the second light emitting unit 1052 may be formed of a green emitting material, and the third light emitting unit 1053 may be formed of a blue emitting material.

Alternatively, the first light emitting unit 1051 may be formed of a green emitting material, the second light emitting unit 1052 may be formed of a red emitting material, and the third light emitting unit 1053 may be formed of a blue emitting material.

In the OLED device illustrated in FIG. 3, descriptions are given to an example in which the first light emitting unit 1051 is of a red emitting material, the second light emitting unit 1052 is of a green emitting material and the third light emitting unit 1053 is of a blue emitting material.

It is to be noted that, that illustrated in a drawing of an embodiment of the invention is an OLED device that contains one pixel unit, which comprises a first light emitting unit 1051, a second light emitting unit 1052 and a third light emitting unit 1053 formed of a red emitting material, a green emitting material and a blue emitting material, respectively. As conceivable by those skilled in the art that, an OLED panel in an actual manufacturing process generally contains a plurality of pixel units arranged in the form of a matrix.

Further, in embodiments of the invention, descriptions will be given to an example in which one pixel unit contains pixel sub-units in three colors of red, green and blue, respectively. As conceivable by those skilled in the art that, the pixel sub-units in the above three colors may be arranged in any order. For example, in the OLED device illustrated in FIG. 3, the pixel units each have an arrangement mode of sequential RGB, i.e., they comprise a red pixel sub-unit, a green pixel sub-unit and a blue pixel sub-pixel arranged sequentially from left to right, respectively. Of course, arranging in a row in an arranging order of RBG, GRB or the other form may also be possible, or RGB are divided into two rows or three rows for arrangement. The cases will not be listed here one by one. Or, one pixel unit can also contain one red pixel sub-unit, one green pixel sub-unit or one blue pixel sub-unit at least. For example, one pixel unit may comprise two groups of red, green and blue pixel sub-units, the arranging order of which may be in the form of RRGGBB, and it may comprise two green pixel sub-units as well, the arranging order of which may be in the form of RGBG, etc. Certainly, this is only an illustrational description, and there is no restriction on the number of pixel sub-units and the arranging mode of the pixel sub-units within one pixel unit in embodiments of the invention.

A small molecular substance may be used as material for producing the organic light emitting layer 105, and it is made by doping a fluorescent material or a phosphorescent material in the small molecular substance. The red emitting material may comprise at least one of rubrene, 4-(dicyanomethylene)-2-tert-butyl-6-(1,1,7,7-tetramethyljulolidin-4-vinyl)-4H-pyran or tris(2-phenylpyridine)iridium; material for the green emitting material may comprise at least one of tris(8-hydroxyquinoline)aluminum, tris(8-hydroxyquinoline)gallium, or (salicylidene-o-aminophenol)-(8-hydroxyquinoline)gallium (III); and the blue emitting material may comprise at least one of 2-methyl-9,10-dinaphthyl-anthracene, 9,10-dinaphthyl-anthracene or 2,5,8,11-tetra(tert-butyl)perylene. For example, thickness of the organic light emitting layer 105 may be in the range of 10 nm to 50 nm. In an embodiment of the invention, a preferred red emitting material may be tris(2-phenylpyridine)iridium; a preferred green emitting material may be tris(8-hydroxyquinoline)aluminum or tris(8-hydroxyquinoline)gallium; and a preferred blue emitting material may be 9,10-dinaphthyl-anthracene or 2,5,8,11-tetra(tert-butyl)perylene.

It is to be noted that, a relatively large number of holes gather in a portion of the organic light emitting layer 105 close to the electron transportation layer 1042 because the carrier mobility of the hole transportation layer 1032 is far greater than the carrier mobility of the electron transportation layer 1042. In order to achieve a balance between transportations of holes and electrons, in the OLED device illustrated in FIG. 3, a hole blocking layer 12 is fabricated between the organic light emitting layer 105 and the electron transportation layer 1042. Thereby, the transportation speed of holes can be decreased, and this allows transportations of holes and electrons to achieve a balance. Thus, the luminous efficiency of the OLED device is enhanced. Material for each of the hole blocking layer 12 and the third light emitting unit 1053 in embodiments of the invention may be a blue emitting material, and owing to a larger bandgap of the blue emitting material, the transportation speed of holes can be decreased effectively. Furthermore, in view of the fact that the hole blocking layer and the third light emitting unit each are a blue emitting material, they can be formed through one patterning process, and use of one mask can be cut down in the manufacturing process of the OLED device. This avoids a system error that occurs when the mask is aligned with the substrate position during its use. Thus, the production flow of the OLED device is effectively simplified, the accuracy of process is enhanced, the quality of products is significantly improved, and the production cost is reduced.

According to an embodiment of the invention, there is further provided a display apparatus, comprising any of the OLED devices as stated above. It has the same beneficial effects as the OLED device provided by the foregoing embodiment of the invention. As the OLED device has been described in detail in the foregoing embodiment, details are omitted here.

The display apparatus provided by the embodiment of the invention comprises an OLED device. By means of producing the hole blocking layer and the third light emitting unit with the same material and with the use of one patterning process, use of one mask can be cut down in the manufacturing process of the OLED device. This avoids a system error that occurs when the mask is aligned with the substrate position during its use. Thus, the production flow of the OLED device is effectively simplified, the accuracy of process is enhanced, the quality of products is significantly improved, and the production cost is reduced.

A manufacturing method of an OLED device provided by an embodiment of the invention can be applied to production of the OLED device provided by the foregoing embodiment, which comprises a first electrode, a second electrode and an organic thin film layer located between the first electrode and the second electrode. Fabrication of the organic thin film layer comprises fabrication of a hole layer, fabrication of an organic light emitting layer and fabrication of an electron layer. Fabrication of the organic light emitting layer comprises the following process:

S101, pattern of a first light emitting unit is formed on a surface of the hole layer through one patterning process.

S102, pattern of a second light emitting unit is formed on a surface of the hole layer through one patterning process.

S103, a hole blocking layer and a third light emitting unit that have the same producing material are formed above the hole layer with the above structures formed through one patterning process.

With respect to the manufacturing method of the OLED device provided by the embodiment of the invention, by means of producing the hole blocking layer and the third light emitting unit with the same material and with the use of one patterning process, use of one mask can be cut down in the manufacturing process of the OLED device. This avoids a system error that occurs when the mask is aligned with the substrate position during its use. Thus, the production flow of the OLED device is effectively simplified, the accuracy of process is enhanced, the quality of products is significantly improved, and the production cost is reduced.

Further, forming pattern of the first light emitting unit 1051 on a surface of the hole layer 103 through one patterning process may be, for example, forming pattern of a red emitting unit on a surface of the hole layer 103 through one patterning process;

forming pattern of the second light emitting unit 1052 on a surface of the hole layer 103 through one patterning process may be, for example, forming pattern of a green emitting unit on a surface of the hole layer 103 through one patterning process;

forming the hole blocking layer 12 and the third light emitting unit 1053 above the hole layer with the above structures formed through one patterning process may be, for example, forming pattern of the hole blocking layer 12 and a blue emitting unit above the hole layer 103 with the above structures formed through one patterning process with a blue emitting material; or, forming pattern of the first light emitting unit 1051 on a surface of the hole layer 103 through one patterning process may be, for example, forming pattern of a green emitting unit on a surface of the hole layer 103 through one patterning process;

forming pattern of the second light emitting unit 1052 on a surface of the hole layer 103 through one patterning process may be, for example, forming pattern of a red emitting unit on a surface of the hole layer 103 through one patterning process;

forming the hole blocking layer 12 and the third light emitting unit 1053 above the hole layer 103 with the above structures formed through one patterning process may be, forming pattern of the hole blocking layer 12 and a blue emitting unit above the hole layer 103 with the above structures formed through one patterning process with a blue emitting material.

It is to be noted that, that illustrated in a drawing is an OLED device that contains one pixel unit, which comprises a first light emitting unit 1051, a second light emitting unit 1052 and a third light emitting unit 1053 formed of a red emitting material, a green emitting material and a blue emitting material, respectively. As conceivable by those skilled in the art that, an OLED panel in an actual manufacturing process generally contains a plurality of pixel units arranged in the form of a matrix.

Further, in embodiments of the invention, descriptions will be given to an example in which one pixel unit contains pixel sub-units in three colors of red, green and blue, respectively.

As conceivable by those skilled in the art that, the pixel sub-units in the above three colors may be arranged in any order. For example, in the OLED device illustrated in FIG. 3, the pixel units each have an arrangement mode of sequential RGB, i.e., they comprise a red pixel sub-unit, a green pixel sub-unit and a blue pixel sub-pixel arranged sequentially from left to right, respectively. Of course, arranging in a row in an arranging order of RBC, GRB or the other form may also be possible, or RGB are divided into two rows or three rows for arrangement. The cases will not be listed here one by one. Or, one pixel unit can also contain one red pixel sub-unit, one green pixel sub-unit or one blue pixel sub-unit at least. For example, one pixel unit may comprise two groups of red, green and blue pixel sub-units, the arranging order of which may be in the form of RRGGBB, and it may comprise two green pixel sub-units as well, the arranging order of which may be in the form of RGBG, etc. Certainly, this is only an illustrational description, and there is no restriction on the number of pixel sub-units and the arranging mode of the pixel sub-units within one pixel unit in embodiments of the invention.

A manufacturing process of the OLED device as illustrated in FIG. 3 will be described below in detail, and its preparation comprises:

S201, a metallic material is coated on a surface of a first substrate 101 so as to form an anode layer 101

By doing this, a first electrode 10 having the anode layer 102 can be obtained.

S202, the first electrode 10 is cleaned.

For example, it is possible that the made-up first electrode 10 is subjected to ultrasonic dust removal in a cleaner, next, superfluous ions on a surface of the first electrode 10 are rinsed out with deionized water, afterwards it is placed in a mixed solvent of acetone and ethanol to ultrasonically remove oil stain, further, it is baked in a clean environment until water is removed fully, it is irradiated with ultraviolet-ray cleaning machine for 10 to 15 minutes, and finally, a surface of the first electrode 10 is bombarded with a low-energy cationic beam.

Figure 4:
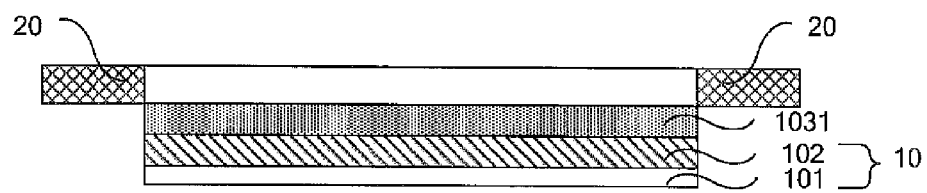
FIGS. 4 to 8 are a structurally schematic view illustrating an OLED device during manufacture provided by an embodiment of the invention.

S203, on a surface of the first electrode 10, as illustrated in FIG. 4, a hole injection layer 1031 is formed by evaporation process with a first mask 20.

For example, in this step, the evaporation speed may be in the range of 0.1 to 0.2 nm/s, and thickness of the evaporated film may be in the range of 12 to 18 nm.

S204, a hole transportation layer 1032 is formed on a surface of the hole injection layer 1031 by evaporation process with the first mask 20.

For example, in this step, the evaporation speed may be in the range of 0.1 to 0.2 nm/s, and thickness of the evaporated film may be in the range of 50 to 70 nm.

S205, on a surface of the hole transportation layer 1032, pattern of a first light emitting unit 1051 is formed through one patterning process.

Figure 5:
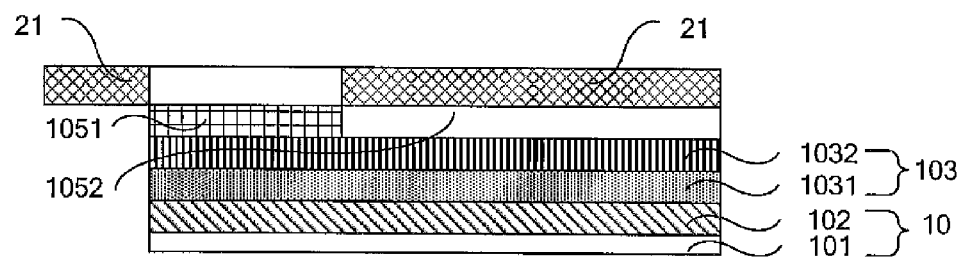

For example, as illustrated in FIG. 5, pattern of the first light emitting unit may be formed by evaporation process with a second mask. The evaporation speed may be in the range of 0.1 to 0.2 nm/s, and thickness of the evaporated film may be in the range of 10 to 50 nm.

S206, on a surface of the hole transportation layer 1032, pattern of a second light emitting unit 1052 is formed through one patterning process.

Figure 6:
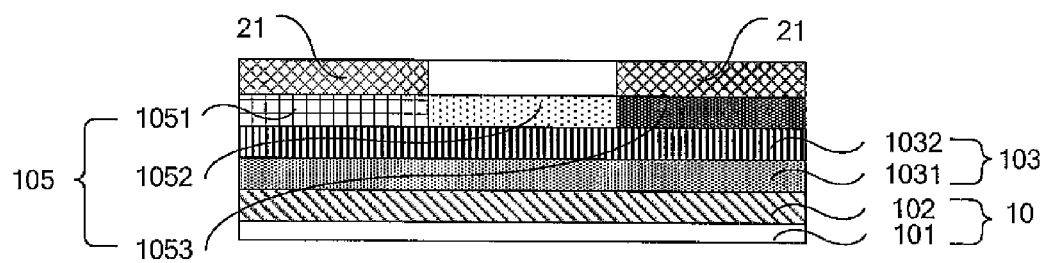

As illustrated in FIG. 6, it is possible that after pattern of the first light emitting unit 1051 is formed, the second mask 21 is shifted for alignment, with the moving distance being the range of each sub-light emitting unit of the first light emitting unit, and pattern of the second light emitting unit is formed by evaporation process with the second mask. Because the first light emitting unit and the second light emitting unit have the same pattern and only differ in location, the same mask can be used upon manufacture of the first light emitting unit and the second light emitting unit. For example, the evaporation speed may be in the range of 0.1 to 0.2 nm/s, and thickness of the evaporated film is in the range of 10 to 20 nm.

It is to be noted that, the patterning zone of the second mask 21 is smaller than the patterning zone of the first mask 20 in the embodiment. The patterning zone refers to an opening zone of the mask.

S207, a hole blocking layer 12 and a third light emitting unit 1053 that have the same producing material are formed above the hole transportation layer 1032 with the above structures formed through one patterning process.

Figure 7:
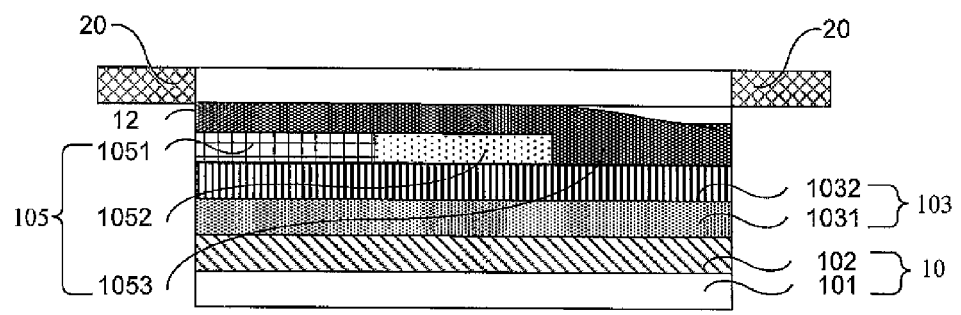

For example, as illustrated in FIG. 7, the hole blocking layer 12 and the third light emitting unit 1053 are formed by evaporation process with the first mask 20.

Material for each of the hole blocking layer 12 and the third light emitting unit 1053 in the embodiment of the invention may be a blue emitting material, and owing to a larger bandgap of the blue emitting material, the transportation speed of holes can be decreased effectively. In addition, in view of the fact that the hole blocking layer and the third light emitting unit are each of a blue emitting material, they can be formed through one patterning process, and use of one mask can be cut down in the manufacturing process of the OLED device. This avoids a system error that occurs when the mask is aligned with the substrate position during its use. Thus, the production flow of the OLED device is effectively simplified, the accuracy of process is enhanced, the quality of products is significantly improved, and the production cost is reduced.

Figure 8:
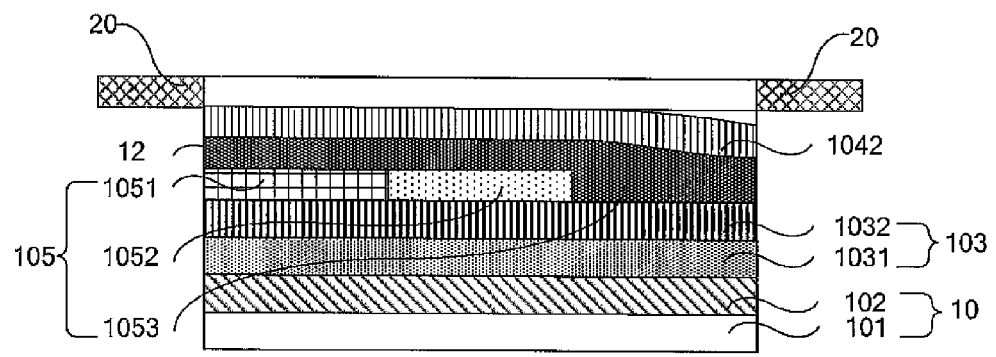

S208, on a surface of the hole blocking layer 12, as illustrated in FIG. 8, an electron transportation layer 1042 is formed by evaporation process with the first mask 20.

For example, in this step, the evaporation speed may be in the range of 0.1 to 0.2 nm/s, and thickness of the evaporated film may be in the range of 20 to 40 nm.

S209, on the electron transportation layer 1042, an electron injection layer 1041 is formed by evaporation process with the first mask 20.

For example, in this step, the evaporation speed may be in the range of 0.1 to 0.2 nm/s, and thickness of the evaporated film may be in the range of 1 to 3 nm.

S210, on a surface of the electron injection layer 1041, a cathode layer 112 may be formed by evaporation process or a sputtering method with the first mask 20.

For example, in this step, the evaporation speed may be in the range of 2 to 3 nm/s, and thickness of the evaporated film may be in the range of 80 to 120 nm.

S211, a second substrate 111 is attached to a surface of the cathode layer 112.

It is to be noted that, conditions for the evaporation process may be that, an evaporation treatment is conducted within a vacuum chamber at a gas pressure of $1\times10^{-5}$ to $9\times10^{-3}$ Pa.

It is to be noted that, the organic light emitting layer 105 comprises a first light emitting unit 1051, a second light emitting unit 1052 and a third light emitting unit 1053, and these three light emitting units in a single color correspond to three primary colors of red, green and blue, respectively, so as to achieve color display of the OLED device. Organic luminous materials for three colors of red, green and blue can be used to fabricate the first light emitting unit 1051, a second light emitting unit 1052 and a third light emitting unit 1053, respectively. For example, the first light emitting unit 1051 is made of any one of the organic luminous materials for three colors of red, green and blue, then the second light emitting unit 1052 and the third light emitting unit 1053 may be made of the organic luminous materials for the other two colors, respectively, and the invention will not set a limit to this.

For example, in the organic light emitting layer 105, the first light emitting unit 1051 provided by the invention may be formed of a red emitting material, the second light emitting unit 1052 may be formed of a green emitting material, and the third light emitting unit 1053 may be formed of a blue emitting material.

Alternatively, the first light emitting unit 1051 may be formed of a green emitting material, the second light emitting unit 1052 may be formed of a red emitting material, and the third light emitting unit 1053 may be formed of a blue emitting material.

In the OLED device illustrated in FIG. 3, descriptions are given to an example in which the first light emitting unit 1051 is of a red emitting material, the second light emitting unit 1052 is of a green emitting material and the third light emitting unit 1053 is of a blue emitting material.

Descriptions made above are merely exemplary embodiments of the invention, but are not used to limit the protection scope of the invention. The protection scope of the invention is determined by attached claims.

The invention claimed is:

1. An OLED device, comprising: a first electrode, a second electrode and an organic thin film layer located between the first electrode and the second electrode,
    wherein, the organic thin film layer comprises a hole layer, an electron layer and an organic light emitting layer located between the hole layer and the electron layer;
    the organic thin film layer further comprises a hole blocking layer that is located between the organic light emitting layer and the electron layer;
    the organic light emitting layer comprises a first light emitting unit, a second light emitting unit and a third light emitting unit;
    the hole blocking layer and the third light emitting unit have a same material, and are integrally formed.

2. The OLED device of claim 1, wherein, the first electrode is an anode, and the second electrode is a cathode;
    the first electrode contacts with the hole layer, and the second electrode contacts with the electron layer.

3. The OLED device of claim 1, wherein, the first electrode comprises: a first substrate and an anode layer located between the first substrate and the hole layer;
    the second electrode comprises: a second substrate and a cathode layer located between the second substrate and the electron layer.

4. The OLED device of claim 3, wherein, material for producing the first substrate and the second substrate comprises glass or a flexible substrate material, and the flexible substrate material comprises at least one selected from the group consisting of a polyester compound and a polyimide compound.

5. The OLED device of claim 3, wherein, material for producing the anode layer comprises an inorganic material or an organic conductive polymer;
    wherein, the inorganic material comprises at least one material selected from the group consisting of zinc oxide, zinc tin oxide, indium tin oxide, metallic materials gold, copper and silver; and the organic conductive polymer comprises at least one material selected from the group consisting of polythiophene, poly(sodium vinyl benzenesulfonate) and polyaniline, the anode layer has a thickness in the range of 50 to 200 nm;
    material for producing the cathode layer comprises a metallic material lithium, magnesium, calcium, strontium, aluminum, or indium, or an alloy of at least one of the metallic materials lithium, magnesium, calcium, strontium, aluminum, and indium and a metallic material copper, gold or silver; the cathode layer has a thickness in the range of 80 to 120 nm.

6. The OLED device of claim 1, wherein, the hole layer comprises a hole injection layer and a hole transportation layer, the hole transportation layer being located on a side close to the organic light emitting layer;
the electron layer comprises an electron injection layer and an electron transportation layer, the electron transportation layer being located on a side close to the organic light emitting layer.

7. The OLED device of claim 6, wherein, material for producing the hole injection layer comprises at least one material of titanium bronze or star polyamine; and the hole injection layer has a thickness in the range of 12 to 18 nm.

8. The OLED device of claim 6, wherein, material for producing the hole transportation layer comprises at least one material of triarylamine materials, and the hole transportation layer has a thickness in the range of 50 to 70 nm.

9. The OLED device of claim 6, wherein, material for producing the electron injection layer comprises at least one material of lithium fluoride or 8-hydroxyquinolinolato-lithiumlithium, wherein, the electron injection layer has a thickness in the range of 1 to 3 nm.

10. The OLED device of claim 6, wherein, material for producing the electron transportation layer comprises at least one of a metal organic complex or an ortho-phenanthroline material; wherein, the electron transportation layer has a thickness in the range of 20 to 40 nm.

11. The OLED device of claim 1, wherein, the first light emitting unit is formed of a red emitting material, the second light emitting unit is formed of a green emitting material, and the third light emitting unit is formed of a blue emitting material; or
the first light emitting unit is formed of a green emitting material, the second light emitting unit is formed of a red emitting material, and the third light emitting unit is formed of a blue emitting material.

12. The OLED device of claim 11, wherein, the red emitting material comprises at least one of rubrene, 4-(dicyanomethylene)-2-tert-butyl-6-(1,1,7,7-tetramethyljulolidin-4-vinyl)-4H-pyran or tris(2-phenylpyridine)iridium;
the green emitting material comprises at least one of tris(8-hydroxyquinoline)aluminum, tris(8-hydroxyquinoline)gallium, or (salicylidene-o-aminophenol)-(8-hydroxyquinoline)gallium(III);
the blue emitting material comprises at least one of 2-methyl-9,10-dinaphthyl-anthracene, 9,10-dinaphthyl-anthracene or 2,5,8,11-tetra(tert-butyl)perylene.

13. A display apparatus, comprising the OLED device of claim 1.

14. A manufacturing method of an OLED device, which comprises a first electrode, a second electrode and an organic thin film layer located between the first electrode and the second electrode, the method comprising fabrication of the organic thin film layer, which comprises fabrication of a hole layer, fabrication of an organic light emitting layer and fabrication of an electron layer, wherein, fabrication of the organic light emitting layer further comprises:
forming pattern of a first light emitting unit on a surface of the hole layer through one patterning process;
forming pattern of a second light emitting unit on a surface of the hole layer through one patterning process;
forming a hole blocking layer and a third light emitting unit that have a same material above the hole layer with the above structures through one patterning process.

15. The manufacturing method of the OLED device of claim 14, wherein, fabricating the first electrode comprises:
coating a metallic material on a surface of a first substrate to form an anode layer.

16. The manufacturing method of the OLED device of claim 15, wherein, fabricating the hole layer comprises:
forming a hole injection layer on a surface of the anode layer of the first electrode by evaporation process with a first mask;
forming a hole transportation layer on a surface of the hole injection layer by evaporation process with the first mask.

17. The manufacturing method of the OLED device of claim 16, wherein, forming pattern of the first light emitting unit on the surface of the hole layer through one patterning process comprises:
on a surface of the hole transportation layer, forming pattern of the first light emitting unit by evaporation process with a second mask;
forming pattern of the second light emitting unit on the surface of the hole layer through one patterning process comprises:
moving the second mask, and forming pattern of the second light emitting unit on a surface of the hole transportation layer by evaporation process with the second mask;
wherein, a patterning zone of the second mask is smaller than a patterning zone of the first mask.

18. The manufacturing method of the OLED device of claim 16, forming the hole blocking layer and the third light emitting unit through one patterning process comprises:
on a surface of the hole transportation layer, forming the hole blocking layer and the third light emitting unit by evaporation process with the first mask.

19. The manufacturing method of the OLED device of claim 16, wherein, fabrication of the electron layer comprises:
forming an electron transportation layer on a surface of the organic light emitting layer by evaporation process with the first mask;
forming an electron injection layer on a surface of the electron transportation layer by evaporation process with the first mask.

20. The manufacturing method of the OLED device of claim 19, wherein, fabrication of the second electrode comprises:
forming a cathode layer on a surface of the electron injection layer by evaporation process or sputtering method with the first mask;
forming a second substrate on a surface of the cathode layer.

21. The manufacturing method of the OLED device of claim 14, wherein, pattern of a red emitting unit is formed on a surface of the hole layer to serve as the pattern of the first light emitting unit; pattern of a green emitting unit is formed on a surface of the hole layer to serve as the pattern of the second light emitting unit; and a hole blocking layer and pattern of a blue emitting unit to serve as the pattern of the third light emitting unit are formed above the hole layer with the above structures formed through one patterning process with a blue emitting material; or
pattern of a green emitting unit is formed on a surface of the hole layer to serve as the pattern of the first light emitting unit; pattern of a red emitting unit is formed on a surface of the hole layer to serve as the pattern of the second light emitting unit; and a hole blocking layer and pattern of a blue emitting unit to serve as the pattern of the third light emitting unit are formed above the hole layer with the above structures formed through one patterning process with a blue emitting material.

* * * * *